United States Patent
Song

(10) Patent No.: US 8,786,998 B2
(45) Date of Patent: Jul. 22, 2014

(54) ELECTRO-MAGNETIC CONTACTOR AND MONITORING SYSTEM OF THE SAME

(75) Inventor: Ki Bong Song, Cheongju-si (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 9 days.

(21) Appl. No.: 13/468,984

(22) Filed: May 10, 2012

(65) Prior Publication Data

US 2012/0300354 A1    Nov. 29, 2012

(30) Foreign Application Priority Data

May 25, 2011  (KR) .......................... 10-2011-0049716

(51) Int. Cl.
*H01H 9/00*  (2006.01)
*H01H 47/00*  (2006.01)
*H01H 51/22*  (2006.01)
*H01H 51/30*  (2006.01)

(52) U.S. Cl.
USPC ........................................................ 361/160

(58) Field of Classification Search
USPC ........................................................ 361/160
See application file for complete search history.

(56) References Cited

U.S. PATENT DOCUMENTS

| | | | |
|---|---|---|---|
| 2,895,026 A | 7/1959 | Rodgers et al. | |
| 4,739,293 A | 4/1988 | Hurley et al. | |
| 4,947,146 A | 8/1990 | Ichimura et al. | |
| 5,737,172 A * | 4/1998 | Ohtsuka | 361/154 |
| 2008/0224878 A1 | 9/2008 | Takada et al. | |
| 2012/0159227 A1* | 6/2012 | Tong et al. | 713/340 |

FOREIGN PATENT DOCUMENTS

| | | |
|---|---|---|
| CN | 101084615 | 12/2007 |
| CN | 2014-89046 | 5/2010 |
| JP | 64-041203 | 2/1989 |
| JP | 2-070223 | 3/1990 |
| JP | 7-12176 | 2/1995 |
| JP | 2003-134554 | 5/2003 |
| JP | 2006-172731 | 6/2006 |
| JP | 2008-512979 | 4/2008 |

OTHER PUBLICATIONS

Japan Patent Office Application Serial No. 2012-117677, Office Action dated Aug. 20, 2013, 3 pages.
The State Intellectual Property Office of the People's Republic of China Application Serial No. 201210167528.9, Office Action dated Mar. 21, 2014, 6 pages.
Japan Patent Office Application Serial No. 2012-117677, Final Rejection dated Mar. 18, 2014, 2 pages.
European Patent Office Application Serial No. 12168643.0, Search Report dated Apr. 3, 2013, 6 pages.

* cited by examiner

*Primary Examiner* — Dharti Patel
(74) *Attorney, Agent, or Firm* — Lee, Hong, Degerman, Kang & Waimey

(57) ABSTRACT

Disclosed herein is an electro-magnetic contactor and an electro-magnetic contactor monitoring system. The present disclosure may sense and display the status of input power that supplies electric energy to a power input end of the electro-magnetic contactor in real time, and when a failure occurs to generate a low voltage or over voltage, it may be sensed in real time to notify it to a user or the like, thereby allowing the user to monitor the status from a remote location. According to the present disclosure, it may be possible to prevent a load from being damaged by a fire due to a phenomenon of chattering in the electro-magnetic contactor, and eradicating a phenomenon that a coil of the contactor is damaged by a fire due to the over voltage, and minimizing losses that can be caused in a factory management system.

8 Claims, 7 Drawing Sheets

ELECTRO-MAGNETIC CONTACTOR AND MONITORING SYSTEM OF THE SAME

CROSS-REFERENCE TO RELATED APPLICATIONS

Pursuant to 35 U.S.C. §119(a), this application claims the benefit of earlier filing date and right of priority to Korean Application No. 10-2011-0049716 filed on May 25, 2011, the contents of which are incorporated by reference herein in its entirety.

BACKGROUND OF THE INVENTION

1. Field of the Invention

The present disclosure relates to an electro-magnetic contactor having a function of sensing the status of input power that supplies electric energy to a power input end of the electro-magnetic contactor and an electro-magnetic contactor monitoring system for monitoring the same from a remote location.

2. Background of the Invention

An electro-magnetic contactor is one of devices for supplying or cutting off power to a load among equipments of elements constituting a factory automation system. The electro-magnetic contactor is a device for controlling a motor through the opening or closing of power. As a device using the principle of an electromagnet, the electro-magnetic contactor implements supplying or cutting off main power to a load circuit when control power is applied or cut off to the contactor, namely, according to a switching signal. In other words, the electro-magnetic contactor supplies or cuts off power to a load according to whether the electromagnetic coil which is one of elements constituting the breaker is excited or not.

FIG. 12 is a block diagram illustrating the configuration of a typical electro-magnetic contactor. Here, reference numeral 10 is input power. The input power 10 may be direct current or alternating current power. A surge absorption unit 21 absorbs and removes a surge voltage contained in the input power 10. A noise filter circuit unit 22 removes a noise component contained in the power from which the surge voltage is removed in the surge absorption unit 21. A rectifier circuit unit 23 rectifies power outputted from the noise filter circuit unit 22 and converts it into direct current power. Reference numeral 25 is an electromagnetic coil, and the electro-magnetic contactor may include only an electromagnetic coil as the need arises. Reference numeral 24 is a discharge circuit unit. The electromagnetic coil 25 and discharge circuit unit 24 are connected in parallel to each other, and the parallel connected one side terminal is connected to an output terminal of the rectifier circuit unit 23. A pulse width modulation unit 27 generates a pulse signal having a predetermined width as a switching signal. For a switching unit 26, an output terminal of the pulse width modulation unit 27 is connected to a gate of the transistor (FET1) and a ground terminal (R1) is connected thereto to detect a current flowing through the electromagnetic coil 25, and a drain of the transistor (FET1) is connected to the other side terminal of the parallel connected electromagnetic coil 25 and the discharge circuit unit 24. In the electro-magnetic contactor having the foregoing configuration, when power is supplied through the input power 10, the surge absorption unit 21 absorbs a surge voltage from the input voltage, and the noise filter circuit unit 22 filters out noise, and the rectifier circuit unit 23 rectifies the filtered voltage and outputs a direct current voltage. Here, when the voltage input to the input power 10 is a direct current voltage, the electro-magnetic contactor may not include the rectifier circuit unit 23. When power is supplied in such a state, the pulse width modulation unit 27 generates a pulse signal having a predetermined width, and the generated pulse signal is applied to a gate of the transistor (FET1) of the switching unit 26. Then, the transistor (FET1) repeats a conducting state and a cut-off state according to the pulse signal outputted from the pulse width modulation unit 27. When the transistor (FET1) is in a conducting state, the output power of the rectifier circuit unit 23 flows to the ground through the electromagnetic coil 25 and transistor (FET1). Then, when the transistor (FET1) is in a cut-off state, power that has been stored in the electromagnetic coil 25 when the transistor (FET1) is in a conducting state flows through the discharge circuit unit 24. Accordingly, the electromagnetic coil 25 continues to maintain an excited state, and due to this, the electro-magnetic contactor continues to maintain a closed state to supply power to the load.

In order to operate the electro-magnetic contactor, an inrush current should be applied to the electromagnetic coil at an initial stage to move the moving core. If the moving core is adhered to the fixed core, then the operating state is maintained even when a holding current far less than the inrush current is applied the electromagnetic coil.

However, if a capacity shortage phenomenon of the operating power in the electro-magnetic contactor, a voltage variation due to the starting load, a lightning, and the like are generated at the time point when an inrush current is applied to the electromagnet of the electro-magnetic contactor, then an instantaneous voltage sag or transient voltage surge may be generated. Due to such a phenomenon, the voltage of the operating power in the electro-magnetic contactor may be less than the operating voltage of the electro-magnetic contactor, and the inrush current continues to flow through the electromagnetic coil, and thus the insulation layer of the electromagnetic coil may be damaged to cause a burn or chattering, thereby creating a problem that the load is damaged by a fire. If a transient voltage is continuously induced, then the insulation layer may be damaged due to an increase of the current flowing through the electromagnetic coil, thereby causing a tremendous loss to the factory automation system.

SUMMARY OF THE INVENTION

According to the embodiments of the present disclosure, an object thereof is to provide an electro-magnetic contactor capable of sensing and displaying the status of input power that supplies electric energy to a power input end of the electro-magnetic contactor in real time.

According to the embodiments of the present disclosure, another object thereof is to provide an electro-magnetic contactor and an electro-magnetic contactor monitoring system capable of monitoring the status of input power, and monitoring the status of input power from a remote location.

In order to accomplish the foregoing objects, an electro-magnetic contactor according to the present disclosure may include a magnetic switching unit connected to the input power to receive the input voltage from the input power, and provided with an electromagnetic coil to supply power to a load while repeating a conducting state and a cut-off state, and a status monitoring unit configured to determine a status of input power, and display the status of input power based on the input power.

In the electro-magnetic contactor according to the present disclosure, the status monitoring unit may include an input voltage detection unit connected to the input power to detect the input voltage, a comparison unit configured to compare the detected input voltage with one or more preset reference voltages to output the input power status according to the comparison result, and a status display unit configured to display the input power status outputted from the comparison unit.

The electro-magnetic contactor according to the present disclosure may further include a signal output unit configured to convert the input power status into a status signal and output the converted status signal to an external device.

In the electro-magnetic contactor according to the present disclosure, the status monitoring unit may further include a surge absorption unit configured to absorb a surge contained in the input voltage when the input voltage is an over voltage, and a constant voltage circuit unit configured to rectify the input voltage to output a constant voltage.

In the electro-magnetic contactor according to the present disclosure, the status monitoring unit may further include a status storage unit configured to store the input power status.

In order to accomplish the foregoing objects, an electro-magnetic contactor monitoring system according to the present disclosure may include an electro-magnetic contactor configured to supply power to a load while repeating a conducting state and a cut-off state, and a terminal connected to the electro-magnetic contactor via a wired or wireless communication means to receive and display the status of input power that supplies electric energy to the electro-magnetic contactor. Here, the electro-magnetic contactor may include a magnetic switching unit connected to the input power to receive an input voltage from the input power and provided with an electromagnetic coil, a status monitoring unit configured to determine a status of the input power to display the input power status, and a signal output unit configured to transmit the input power status.

According to the embodiments of the present disclosure, the electro-magnetic contactor may sense and display the status of input power that supplies electric energy to a power input end of the electro-magnetic contactor in real time.

Furthermore, according to the embodiments of the present disclosure, when a failure occurs at the input power to cause a low voltage or over voltage, it may be sensed in real time to notify it to a user or the like, thereby allowing the user to monitor the status from a remote location.

In addition, according to the present disclosure, it may be possible to prevent a load from being damaged by a fire due to a phenomenon of chattering in the electro-magnetic contactor, and eradicating a phenomenon that a coil of the contactor is damaged by a fire due to the over voltage, and minimizing losses that can be caused in a factory management system.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Hereinafter, an electro-magnetic contactor and an electro-magnetic contactor monitoring system according to the present disclosure will be described with reference to the accompany drawings.

Figure 11:
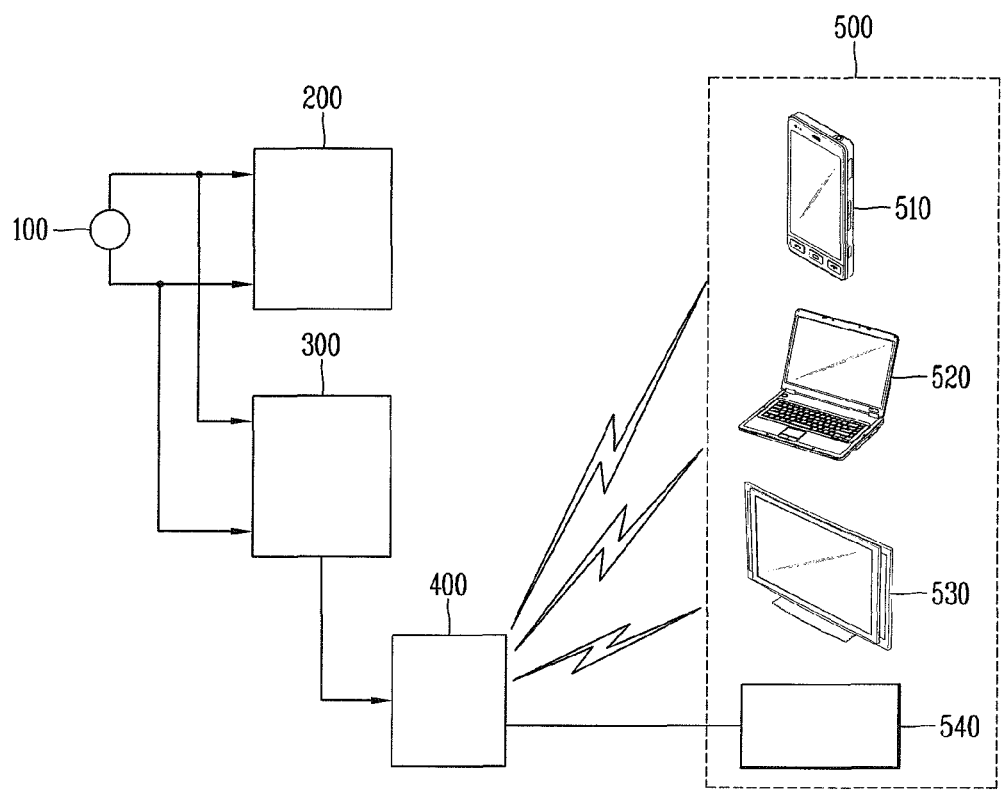
FIG. 11 is a block diagram illustrating the configuration of an electro-magnetic contactor monitoring system according to an embodiment of the present disclosure.
Figure 12:
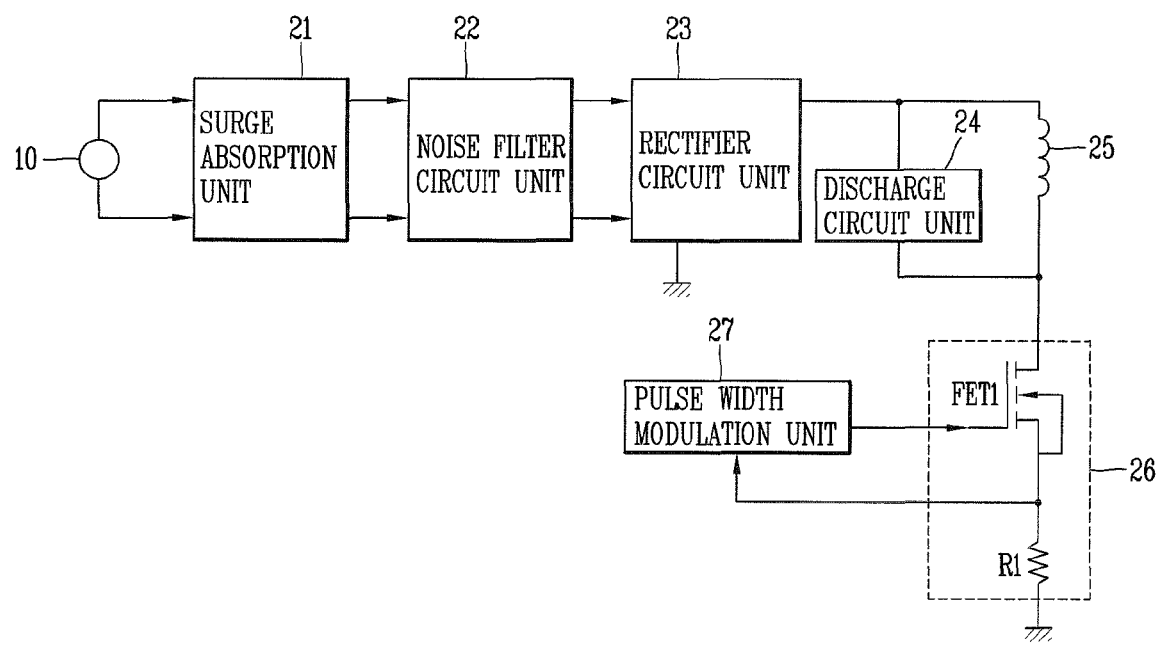
FIG. 12 is a block diagram illustrating the configuration of a typical electro-magnetic contactor.

Referring to FIG. 11, an electro-magnetic contactor monitoring system according to an embodiment may include an electro-magnetic contactor and a terminal 500. The electro-magnetic contactor may supply power to a load while repeating a conducting state and a cut-off state. The terminal 500 may be connected to the electro-magnetic contactor via a wired or wireless communication means to receive and display the status of input power that supplies electric energy to the electro-magnetic contactor.

Here, the electro-magnetic contactor may include a magnetic switching unit connected to the input power to receive an input voltage from the input power and provided with an electromagnetic coil, a status monitoring unit configured to determine a status of the input power to display the input power status, and a signal output unit configured to transmit the input power status.

The terminal may be a display device, for example, an LCD, an LED, a speaker, and the like, which are connected with a wired communication means. Furthermore, the terminal may be a mobile communication terminal, for example, a mobile phone, a PDA, a smartphone, and the like, a display device, or the like which are connected with a wireless communication means.

Figure 1:
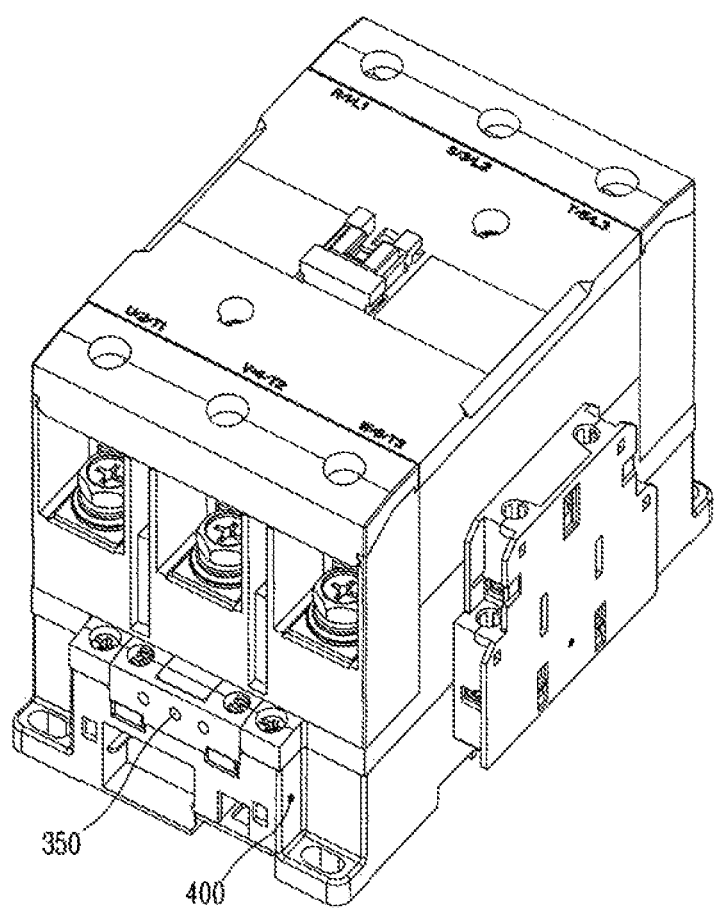
FIG. 1 is a perspective view illustrating the external appearance of an electro-magnetic contactor according to the embodiments of the present disclosure.
Figure 2:
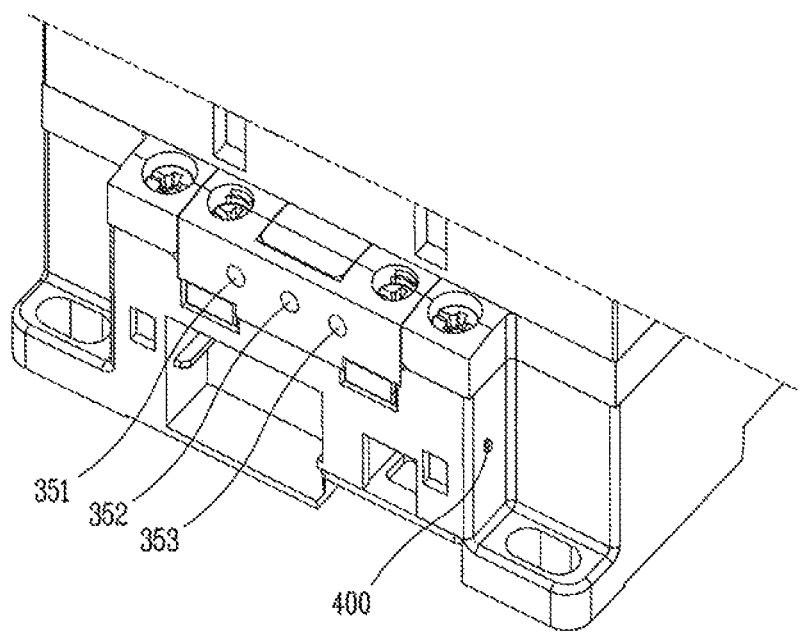
FIG. 2 is a perspective view specifically illustrating a status display unit of the electro-magnetic contactor according to the embodiments of the present disclosure.
Figure 3:
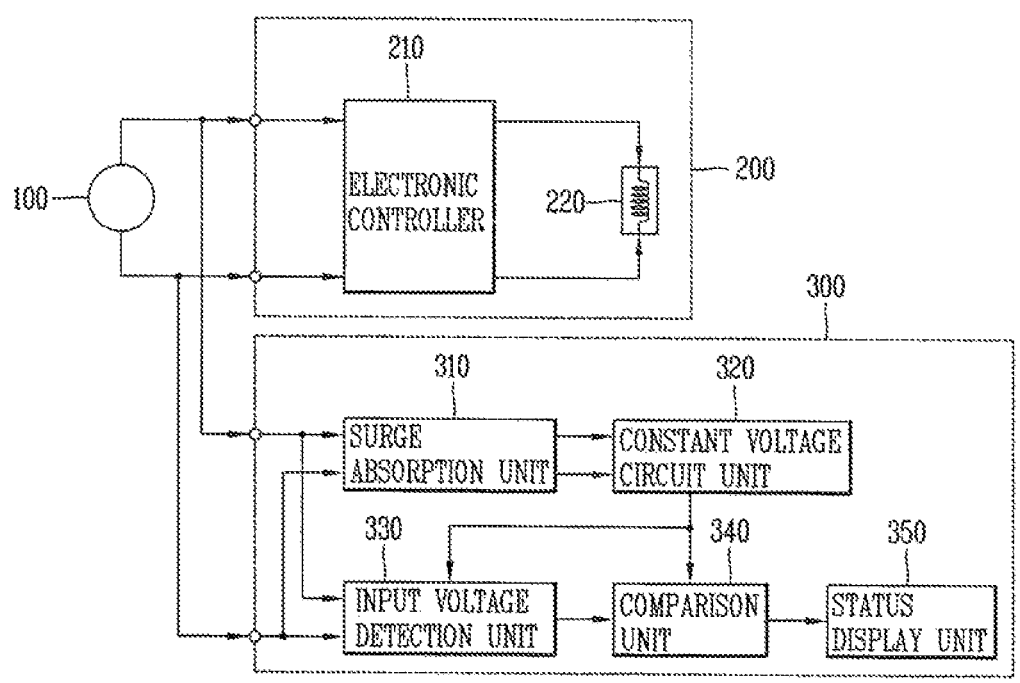
FIGS. 3 through 5 are block diagrams illustrating the configuration of an electro-magnetic contactor according to the embodiments of the present disclosure.

Referring to FIGS. 1 through 3 together, an electro-magnetic contactor according to the embodiments of the present disclosure may include an magnetic switching unit 200 and a status monitoring unit 300. The magnetic switching unit 200 may be connected to the input power 100 to receive an input voltage from the input power, and provided with an electro-magnetic coil 220 to supply power to a load while repeating a conducting state and a cut-off state. The status monitoring unit 300 may determine a status of the input power, and display the input power status based on the input voltage.

Referring to FIG. 3, the magnetic switching unit 200 may include an electronic controller 210 and an electromagnetic coil 220. The magnetic switching unit 200 may be configured with a single structure of the electromagnetic coil 220.

The electronic controller 210 may include a surge absorption unit for absorbing and removing a surge voltage contained in the input power 100, a noise filter circuit unit for removing a noise component contained in the power from which the surge voltage, and a rectifier circuit unit for rectifying the power being outputted from the noise filter circuit unit to convert it into direct current power.

The electronic controller is connected in parallel to the electromagnetic coil 220, and the parallel connected one side terminal may further include a discharge circuit unit connected to an output terminal of the rectifier circuit unit. The electronic controller may further include a pulse width modulation unit for generating a pulse signal having a predetermined width as a switching signal. An output terminal of the pulse width modulation unit and a ground resistor for detecting a current flowing through the electromagnetic coil 220 are connected to a gate of the transistor, and the other side terminal of the parallel connected electromagnetic coil 220 and the other side terminal of the discharge circuit unit are connected to a drain of the transistor.

The status monitoring unit 300 may include an input voltage detection unit 330 connected to the input power to detect the input voltage, a comparison unit 340 configured to compare the detected input voltage with one or more preset reference voltages to output the input power status according to the comparison result, and a status display unit 350 configured display the input power status outputted from the comparison unit 340.

Figure 4:
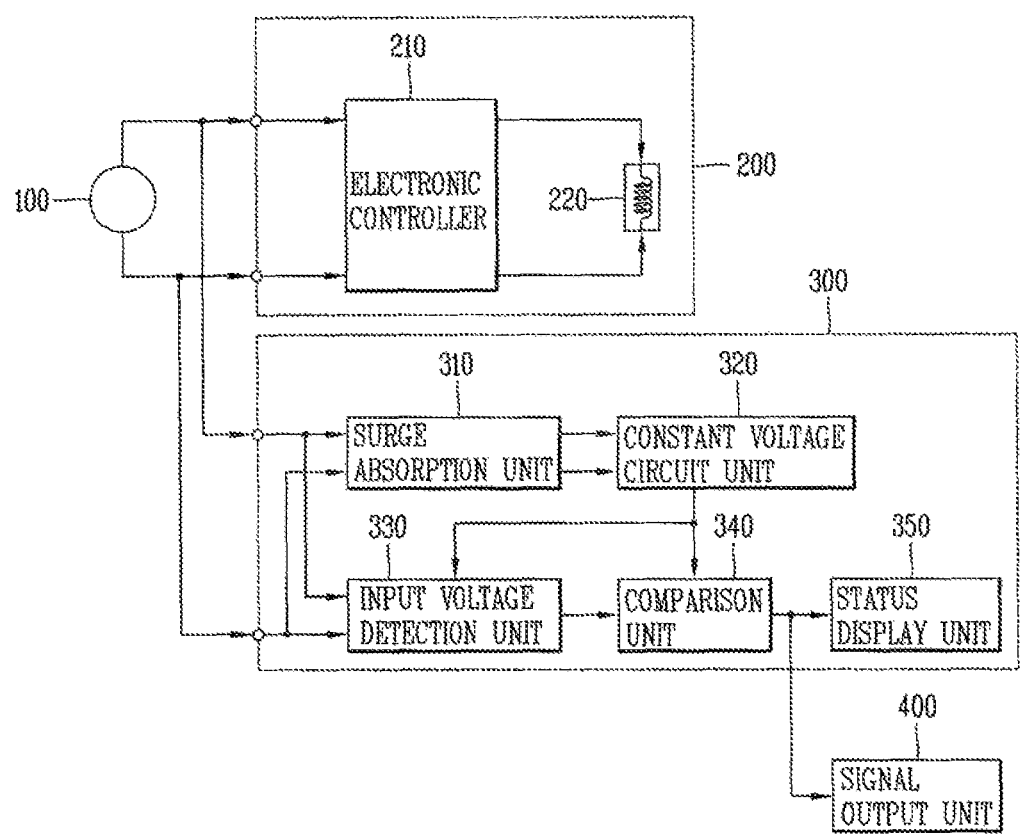
Figure 5:
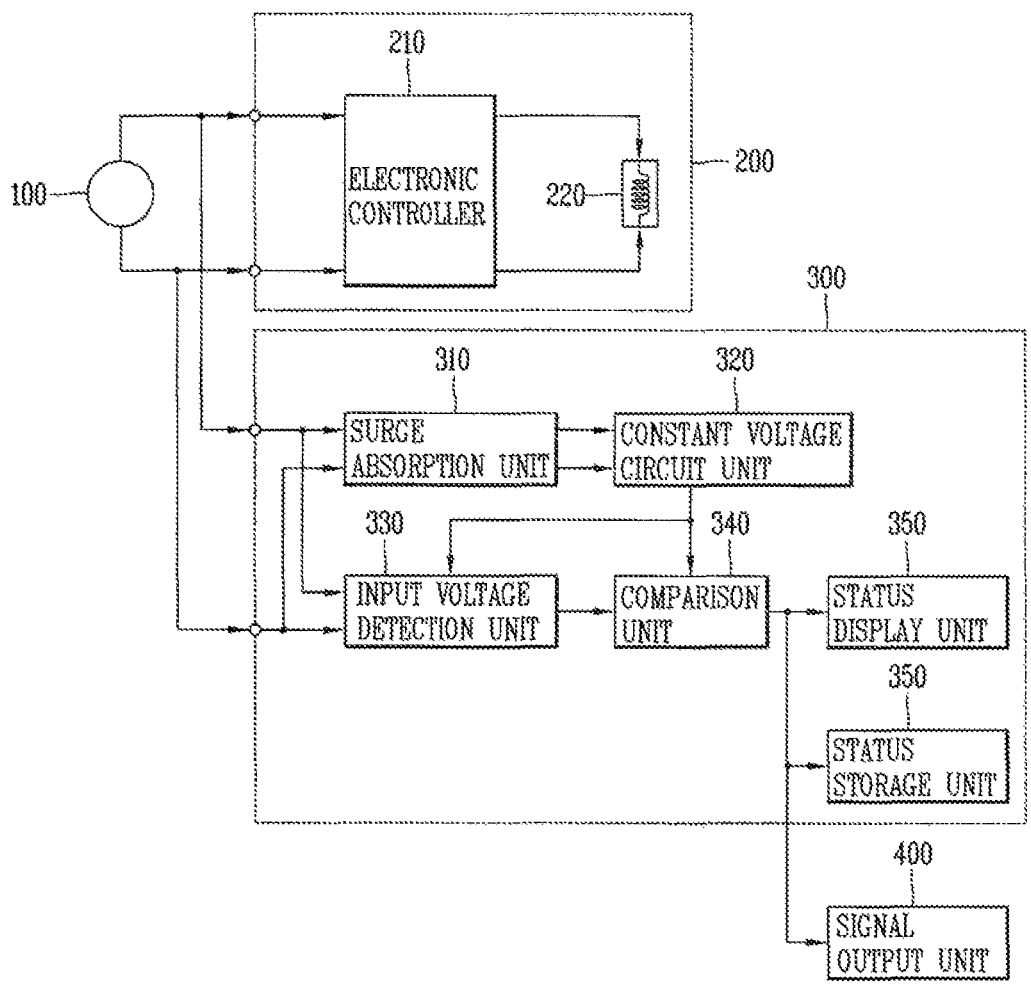

Referring to FIGS. 3 through 5, the status monitoring unit 300 may further include a surge absorption unit 310 configured to absorb a surge contained in the input voltage when the input voltage is an over voltage, and a constant voltage circuit unit 320 configured to rectify the input voltage to output a constant voltage.

When noise such as a transient voltage is induced, the surge absorption unit 310 protects internal electronic components. The constant voltage circuit unit 320 rectifies a direct current voltage or alternating current voltage received through the input power 100 to output a constant static voltage.

Figure 6:
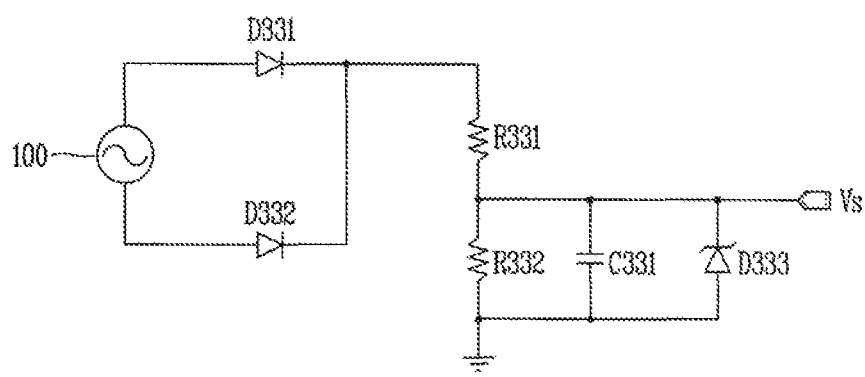
FIG. 6 is a circuit diagram illustrating an input voltage detection unit of the electro-magnetic contactor according to the embodiments of the present disclosure.

Referring to FIG. 6, the input voltage detection unit 330 may include rectifier diodes (D331, D332), and a resistor divider circuit (R331, R332) for converting a direct current voltage alternately rectified through the rectifier diodes (D331, D332) from an alternating current voltage into a low voltage level, a smoothing condenser (C331) for reducing the size of a ripple voltage, and a diode (D333) for preventing internal electronic components from being damaged by a fire due to a transient voltage. An input voltage detection signal detected from the input voltage detection unit 330 is used for an input signal of the comparison unit 340.

Figure 7:
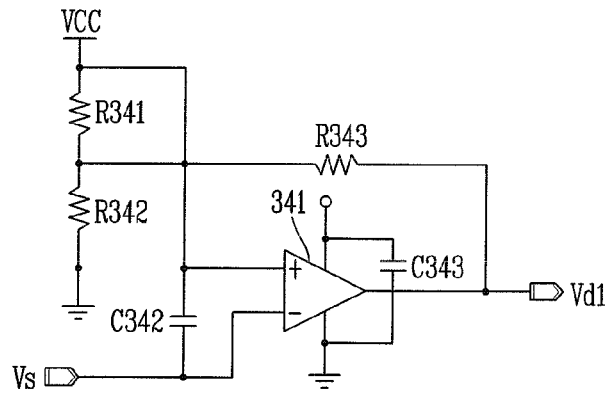
FIGS. 7 through 9 are circuit diagrams illustrating a comparison unit of the electro-magnetic contactor according to the embodiments of the present disclosure.
Figure 8:
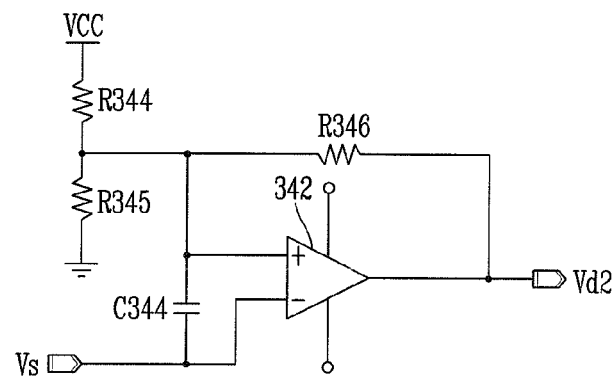
Figure 9:
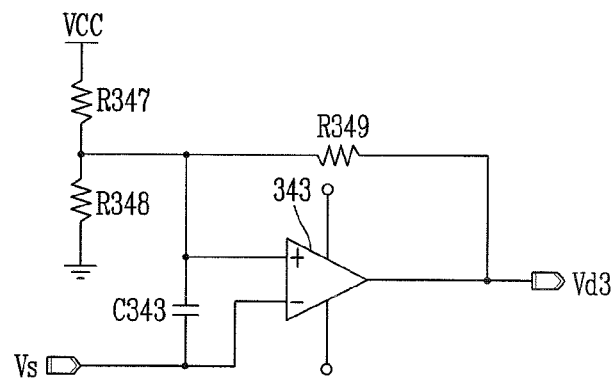
Figure 10:
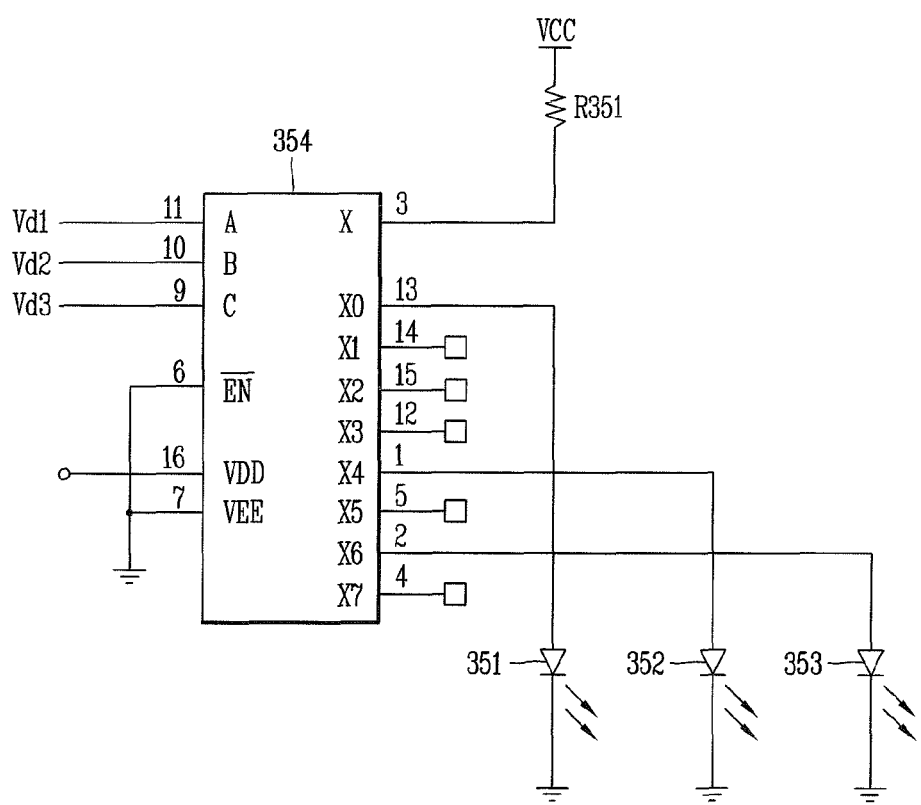
FIG. 10 is a circuit diagram illustrating an example of a status display unit of the electro-magnetic contactor according to the embodiments of the present disclosure.

Referring to FIG. 7, the comparison unit 340 may include a reference voltage unit configured with a resistor divider circuit (R341, R342), a comparator, and a resistor (R343) having a hysteresis characteristic. Even in case of FIGS. 8 and 9, the comparison unit 340 may include the same resistors (R344 to R346, R347 to R349). The foregoing configurations compare and determine whether it is a low voltage, a rated voltage, or an over voltage to output the status to the status display unit 350.

The status display unit 350 receives a voltage signal (Vd1, Vd2, Vd3) outputted from the comparison unit 340 to display the status through an output means. The status display unit 350 may be configured with a plurality of light-emitting diodes 351, 352, 353 to notify the status of input power to the user or the like using different colors, respectively.

Referring to FIG. 4, the electro-magnetic contactor may further include a signal output unit 400 for converting the input power status into a status signal and output the converted status signal to an external device. Here, the external device may be a terminal in the electro-magnetic contactor monitoring system.

The signal output unit 400 may include a communication module to transmit the voltage signal (Vd1, Vd2, Vd3) outputted through the light-emitting diodes of the status display unit 350 to a terminal at a remote distance. At this time, the comparison unit 340 and the terminal are connected to each other via a wired or wireless communication means to transmit and receive signals.

Referring to FIG. 5, the status monitoring unit 300 may further include a status storage unit 360 for storing the input power status. In other words, an electro-magnetic contactor according to the present disclosure may display the input power status through the status display unit 350, or notify the input power status through the signal output unit 400 to the user or the like at a remote distance, and store the status to use the stored data later in a cooperative or independent manner.

As described above, an electro-magnetic contactor and an electro-magnetic contactor monitoring system according to the embodiments of the present disclosure may sense and display the status of input power that supplies electric energy to a power input end of the electro-magnetic contactor in real time, and when a failure occurs to generate a low voltage or over voltage, it may be sensed in real time to notify it to a user or the like, thereby allowing the user to monitor the status from a remote location. According to the embodiments of the present disclosure, it may be possible to prevent a load from being damaged by a fire due to a phenomenon of chattering in the electro-magnetic contactor, and eradicating a phenomenon that a coil of the contactor is damaged by a fire due to the over voltage, and minimizing losses that can be caused in a factory management system.

What is claimed is:

1. An electro-magnetic contactor for supplying or cutting off power to a load, the electro-magnetic contactor comprising:
   a status monitoring circuit configured to determine a status of input power, and display the status of the input power based on an input voltage of the input power that supplies electric energy to the electro-magnetic contactor; and
   a magnetic switching circuit connected to the input power in parallel to the status monitoring circuit, the magnetic switching circuit configured to receive the input voltage from the input power, and provided with an electromagnetic coil to supply power to a load while repeating a conducting state and a cut-off state
   wherein the status monitoring circuit comprises:
      an input voltage detection circuit connected to the input power and configured to detect the input voltage;
      a comparison circuit connected to an output of the input voltage detection circuit and configured to
         compare the detected input voltage with one or more preset reference voltages, and
         output the status of the input power according to a corresponding comparison result;
      a display connected to an output of the comparison circuit and configured to display the status of the input power outputted from the comparison circuit;
      a surge absorption circuit connected to the input power in parallel to the input voltage detection circuit, the surge absorption circuit configured to absorb a surge contained in the input voltage when the input voltage is an over voltage; and
      a constant voltage circuit having an input connected to an output of the surge absorption circuit, the constant voltage having an output connected to each of the input voltage detection circuit and the comparison circuit, the constant voltage circuit configured to rectify the input voltage to output a constant voltage,
      wherein the voltage detection circuit and the comparison circuit are each configured to operate in accordance with a signal from the constant voltage circuit.

2. The electro-magnetic contactor of claim 1, further comprising:
a signal output circuit configured to convert the status of the input power into a status signal and output the converted status signal to an external device.

3. The electro-magnetic contactor of claim 1, wherein the status monitoring circuit displays one input power status among an over voltage, a rated voltage, and a low voltage.

4. The electro-magnetic contactor of claim 1, wherein the status monitoring circuit further comprises:
a status storage unit configured to store the status of the input power.

5. An electro-magnetic contactor monitoring system, comprising:
an electro-magnetic contactor configured to supply power to a load while repeating a conducting state and a cut-off state; and
a terminal connected to the electro-magnetic contactor via a wired or wireless communication link, the terminal configured to receive and display a status of input power that supplies electric energy to the electro-magnetic contactor,
wherein the electro-magnetic contactor comprises
a magnetic switching circuit connected to the input power to receive an input voltage from the input power and provided with an electromagnetic coil, and
a status monitoring circuit connected to the input power in parallel to the magnetic switching circuit and configured to determine the status of the input power and to display the status of the input power,
wherein the status monitoring circuit comprises:
an input voltage detection circuit connected to the input power and configured to detect the input voltage;
a comparison circuit connected to an output of the input voltage detection circuit and configured to
compare the detected input voltage with one or more preset reference voltages, and
output the status of the input power according to a corresponding comparison result;
a display connected to an output of the comparison circuit and configured to display the status of the input power outputted from the comparison circuit;
a surge absorption circuit connected to the input power in parallel to the input voltage detection circuit, the surge absorption circuit configured to absorb a surge contained in the input voltage when the input voltage is an over voltage; and
a constant voltage circuit having an input connected to an output of the surge absorption circuit, the constant voltage having an output connected to each of the input voltage detection circuit and the comparison circuit, the constant voltage circuit configured to rectify the input voltage to output a constant voltage,
wherein the voltage detection circuit and the comparison circuit are each configured to operate in accordance with a signal from the constant voltage circuit.

6. The electro-magnetic contactor monitoring system of claim 5, wherein the electro-magnetic contactor further comprises a signal output circuit configured to transmit the status of the input power.

7. The electro-magnetic contactor monitoring system of claim 5, wherein the status monitoring circuit further comprises:
a status storage unit configured to store the status of the input power.

8. The electro-magnetic contactor monitoring system of claim 5, wherein the status monitoring circuit displays one input power status among an over voltage, a rated voltage, and a low voltage.

* * * * *